United States Patent [19]

Beasley

[11] Patent Number: 4,701,623
[45] Date of Patent: Oct. 20, 1987

[54] CHARGED PARTICLE BEAM APPARATUS

[75] Inventor: James P. Beasley, Tadworth, England

[73] Assignee: U.S. Philips Corporation, New York, N.Y.

[21] Appl. No.: 768,581

[22] Filed: Aug. 23, 1985

[30] Foreign Application Priority Data

Sep. 5, 1984 [GB] United Kingdom ............... 8422405

[51] Int. Cl.[4] ............................................. G21K 5/04
[52] U.S. Cl. .............................. 250/492.2; 250/396 R; 250/396 ML; 250/398
[58] Field of Search ................. 250/310, 311, 396 R, 250/396 ML, 398, 492.2; 378/34

[56] References Cited

U.S. PATENT DOCUMENTS 3,787,696 1/1974 Dao et al. ............................ 250/310

FOREIGN PATENT DOCUMENTS 0057242 5/1981 Japan ............................. 250/396 R

OTHER PUBLICATIONS

"A Self-Cleaning Electron Microscope Aperture Diaphragm", by G. J. S. Zhadanov, Sov. J. Opt. Technol., vol. 41, No. 9, Sep. 1974.

Primary Examiner—Carolyn E. Fields
Assistant Examiner—John C. Freeman
Attorney, Agent, or Firm—Paul R. Miller

[57] ABSTRACT

An apparatus, such as an electron beam column (1), with high-speed deflection capability comprises a gun (2) which directs a beam (3) of charged particles by several magnetic lenses (9,11,13a,13b) towards a target (4). Magnetic deflection coils (12a,12b) produce a variable magnetic field for controllably deflecting the beam. The beam is surrounded by an electrically conductive surface (16a,16b,22) which in the vicinity of the deflection coils is constituted by a tube (22) comprising a single wire of, for example, nichrome preferably coated by an oxide film formed naturally and comprising a close-wound helix. This tube construction has a longitudinal resistance which significantly impedes the flow of undesirable eddy currents therein. On the other hand the tube can readily conduct along a helical path so that charge accumulation on the tube walls is avoided.

9 Claims, 1 Drawing Figure

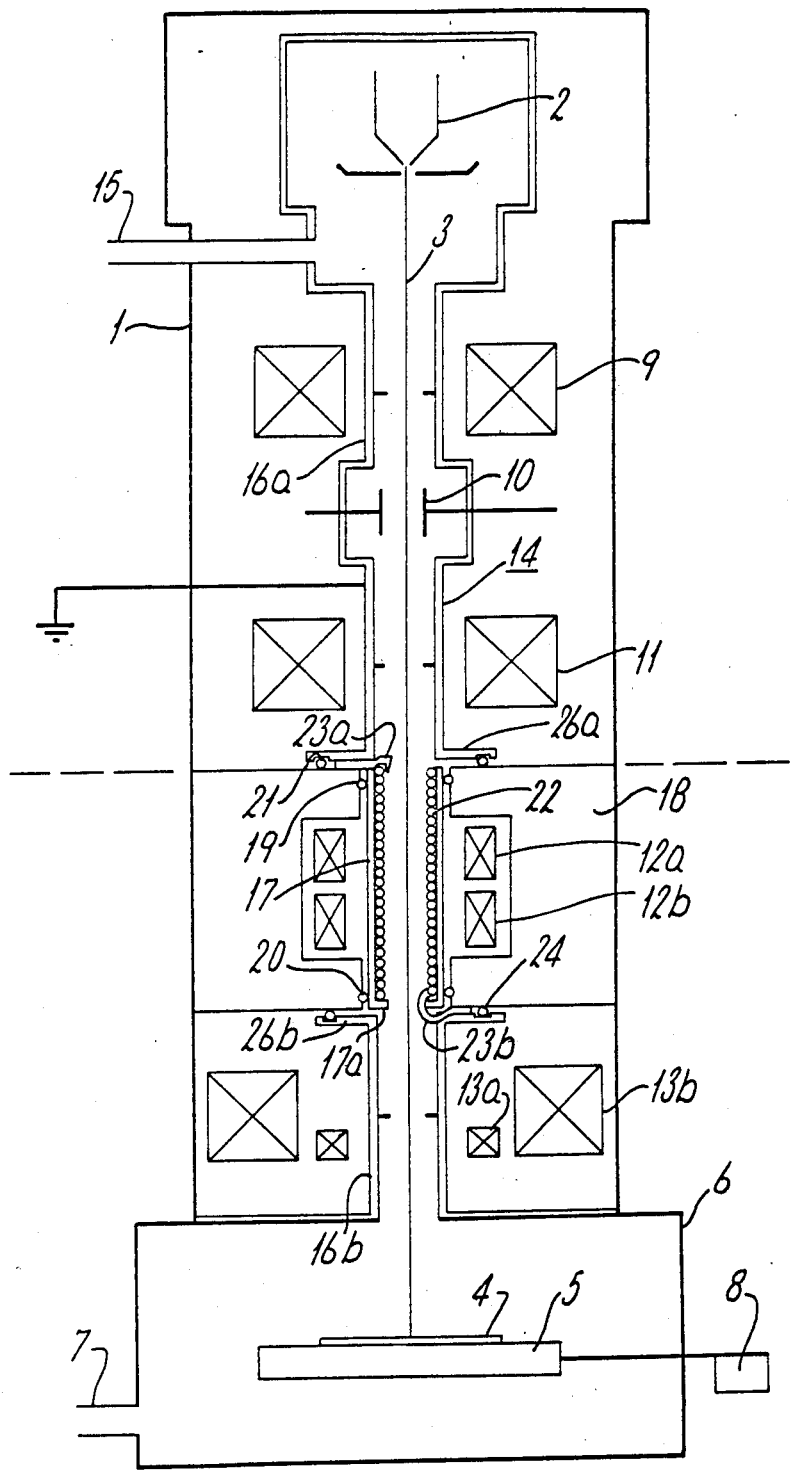

CHARGED PARTICLE BEAM APPARATUS

This invention relates to a charged particle beam apparatus comprising means for generating a beam of charged particles, means for directing the beam towards a target, an electrically conductive tube disposed such that the beam can travel longitudinally through the bore of the tube, and means disposed outside the tube for generating within the tube a variable magnetic field.

The beam of charged particles may be used to effect a lithographic process at a surface of a target. For example, in the manufacture of semiconductor devices it is known to use a charged particle beam apparatus in the form of a so-called electron beam column to direct an electron beam towards a semiconductor wafer coated with an electron sensitive resist and to write a predetermined pattern in the resist by computer control of the beam. After exposure the resist is developed to form a masking layer which can be used subsequently in the processing of the semiconductor wafer.

It is usual practice in such apparatus to arrange the beam of charged particles to be at all times surrounded by an electrically conductive tube disposed such that the beam can travel longitudinally through the bore of the tube. The conductive tube is generally grounded allowing charge, which otherwise would accumulate on surfaces around the beam, to leak away. Accumulation of charge is undesirable because it can give rise to uncontrollable beam deflections.

In normal operation, part of the conducting tube will be subject to a changing magnetic field. For example, in order that the beam of charged particles can be deflected controllably, magnetic deflection coils are commonly employed outside the tube to generate a variable magnetic field inside the tube, and transversely to the axis of the tube. By changing the current in the deflection coils the magnetic field strength is caused to vary thereby deflecting the charged particle beam.

Unfortunately, however, a changing magnetic field gives rise to eddy currents which can flow in the conducting tube in closed loops around the magnetic field lines. In tun the eddy currents give rise to another magnetic field which opposes the deflecting magnetic field thereby reducing the overall field strength. Although this is only a transient effect and the full strength of the deflecting field is realized when the eddy currents eventually die away, it is nevertheless a significant disadvantage because deflection times are consequently increased. Unfortunately, this disadvantage is particularly pronounced in apparatus intended for high speed operation because the effect of eddy currents is greater with high frequency magnetic field changes.

Attempts have been made to overcome this problem by increasing the overall resistance of the conductive tube in order to impede the flow of eddy currents. To this end it is known to provide the conductive tube as a relatively thin lining on the internal surface of an insulating tube. This conductive lining is usually provided by evaporation but, however provided, it is very difficult to achieve a uniform coating over the whole internal surface of a relatively long thin insulating tube. In any case the lining may be still sufficiently conductive to support appreciable eddy currents.

Moreover, when the apparatus is used, contaminants build up on the conductive lining and this eventually necessitates removal of the insulating tube from the apparatus so that the lining can be cleaned. Clearly this is inconvenient particularly when the insulating tube also forms part of a vacuum envelope, as is usual, in which case a complex sealing arrangement is necessary to ensure that the vacuum enveloped is restored when the insulating tube is replaced.

According to the present invention there is provided a charged particle beam apparatus comprising means for generating a beam of charged particles, means for directing the beam towards a target, an electrically conductive tube disposed such that the beam can travel longitudinally through the bore of the tube, and means disposed outside the tube for generating within a tube a variable magnetic field, characterised in that the tube comprises a filamentary conductor formed into a close-wound helix.

A conductive tube having this helical construction has the advantage that it readily conducts along a helical path and hence allows charge to leak away - along the helical path. Longitudinally, however, conduction is severely impeded because at most there is only minimal (tangential) physical contact between adjacent turns of the helix. This is highly advantageous because the tube thus formed cannot readily support eddy currents, and in the absence of this transient response, the beam of charged particles can be deflected controllably in a significantly shorter time period.

Another important advantage of a helically wound conducting tube is that it is relatively straightforward to form and avoids the difficulty associated with the prior art of providing a uniform conductive coating on the internal surface of an insulating tube.

Also, as discussed in greater detail below, with this tube construction a heating current can be passed through the helix to deter the build up of contaminants thereon and thereby prolonging the useful operating life of a given tube before requiring it to be changed or cleaned.

In order to virtually eliminate the effect of eddy currents it is preferable that the helix is adapted to provide means between adjacent turns of the helical filamentary conductor whereby current flow in the direction of the tube axis is impeded. For example, such current impedance means may comprise a relatively thin resistive film coating provided on the filamentary conductor. This resistive film may be an oxide formed naturally on the conductor material.

Preferably the helix is provided inside an insulating tube which may form part of a vacuum envelope. In this case, it is also preferable that the helix is present as a removable insert in the tube so that the helix can be taken out from the apparatus for cleaning or replacement without disturbing the insulating tube. This has the advantage, compared with the prior art arrangement mentioned above, that a less complex sealing arrangement can be used for the vacuum envelope.

An embodiment of the invention will now be described, by way of example, with reference to the accompanying drawing in which:

The single FIGURE is a schematic cross-sectional view of an electron beam lithography apparatus in accordance with the invention.

It is noted that, for the sake of clarity, the drawing is not to scale.

The electron beam lithography apparatus shown in the FIGURE comprises an electron optical column 1 including an electron gun 2 for generating an electron beam 3 and for directing the beam as a Gaussian round spot beam towards a target 4 such as a semiconductor wafer coated with an electron sensitive resist.

The semiconductor wafer 4 is mounted on an X-Y stage 5 in an evacuable workchamber 6 which is connected to a vacuum pump (not shown) via a conduit 7. The X-Y stage 5 is driven from outside the workchamber 6 by a motor 8.

Before impinging on the wafer 4, the beam 3 passes through various electron-optical stages of the column in the following order: a first demagnifying magnetic lens 9, an electrostatic beam blanker 10, a second demagnifying lens 11, a pair of magnetic deflection coils 12a, 12b, and a final magnetic lens system comprising an objective lens 13a and separate lens assembly 13b for automatic focus and stigmation. It is noted that all the lenses are shown schematically in the FIGURE. As is well known to those skilled in the art, a magnetic lens comprises an electrically conductive coil enclosed within a soft ferromagnetic member forming the pole pieces of the magnet.

The features of the electron beam column described so far are well-known in the art and so no further details need be given here. For more information reference is invited, for example, to the paper by J. P. Beasley and D. G. Squire entitled "An Electron Beam Maskmaker" which appeared in IEEE Transactions on Electron Devices, Vol. ED-22, No. 7, July 1975, at pages 376–384.

As shown in the Figure the column also comprises a central vacuum envelope 14 which at its lower end communicates with the workchamber 6. At its upper end the envelope 14 houses the electron gun 2 and is connected to a vacuum pump (not shown) via a conduit 15. Between the electron gun 2 and the workchamber 6 the vacuum envelope comprises two electrically conductive tube parts 16a, 16b made of metal such as stainless steel. The magnetic demagnifying lenses 9 and 10 are disposed outside the vacuum envelope and surround the tube part 16a in a concentric manner. Similarly the magnetic lenses 13a, 13b of the final lens system are disposed outside the vacuum envelope and concentrically surround the tube part 16b.

Between the metal tube parts 16a and 16b in the vicinity of the deflection coils 12a, 12b the vacuum envelope is completed by a glass tube 17. In the present case the bore of the glass tube 17 is similar in diameter to that of the metal parts 16a, 16b which diameter may be, for example 10 mm. It is noted, however, that this dimension is not critical and may be different from the bore diameter of the metal tube parts 16a, 16b.

The deflection coils 12a, 12b surround the glass tube 17 in a concentric manner and are disposed approximately mid-way along the length thereof, although at least longitudinally the relative position is not critical. Also, the length of the glass tube 17 is not critical but may be, for example, 15 cm. In this example tube 17 projects above the upper deflection coil 12a and below the lower deflection coil 12b. At its upper and lower ends the glass tube is sealed to a wall portion 18 of the column by respective O-rings 19,20. Also O-ring seals 21, 24 are present respectively between the upper side of wall portion 18 and an outwardly extending flange 26a at the lower end of the metal tube part 16a, and between the lower side of wall portion 18 and an outwardly extending flange 26b at the upper end of the metal tube part 16b. Thus an effective vacuum seal is provided between the glass tube 17 and the metal tube parts 16a and 16b of the vacuum envelope 14.

Present inside the glass tube 17 is an electrically conductive tube comprising a single wire formed into a close-wound helix 22. In this case the radial dimensions of the helix match approximately the internal diameter of the glass tube 17, but the fit is sufficiently loose to allow the helix 22 to be removed and re-inserted easily. It is noted however, that in an alternative arrangement the diameter of the helix may be significantly smaller than the bore of the glass tube 17. At its lower end the glass tube 17 comprises an inwardly extending flange 17a on which the bottom of the helix 22 rests. In the case where the helix is significantly narrower than the glass tube the flange 17a may also be provided with locating projections for centering the helix.

The helix 22 may be made for example of $\frac{1}{2}$ mm diameter nichrome wire covered with an oxide film coating. In the case of nichrome a relatively thin layer of oxide is formed naturally on the wire and this natural oxide forms a resistive coating which is desirable for present purposes. The wire is formed into a helix by winding it around a former having appropriate dimensions in such manner that adjacent turns of the helix are contiguous, and the former is subsequently removed. The thin resistive film serves to impede the flow of current in the longitudinal direction of the helix whereas, to all intents and purposes, an electron beam is passing through the bore of the helix is always surrounded by a conductive surface.

At each end of the helix a short length of the nichrome wire is left unwound to provide electrical connection 23a and 23b to the metal tube parts 16a and 16b respectively. The unwound length of wire 23a is led out of the upper end of the glass tube 17 and sandwiched between an upwardly directed face of the wall portion 18 and the flange 26a of the tube part 16a, and may be fastened to the wall portion 18, for example with a screw. At the lower end the unwound length of wire 23b is led out of the glass tube 17 and sandwiched between a downwardly directed face of the wall portion 18 and the flange 26b of the tube part 16b, and may be fastened to the wall portion 18, for example with a screw.

Thus by connecting the metal tube part 16a to ground potential as shown, the helix 22 and the tube part 16b, being electrically connected, are also grounded so that the electron beam 3 in passing along the length of the column is at all times surrounded by a grounded conductive surface whereby stray charge-which otherwise would accumulate on the internal surfaces of the column-can leak to ground.

As discussed previously it will be necessary from time to time to remove the conductive helix for cleaning or replacement because of the gradual build up of contaminants thereon. For this purpose the top and bottom sections of the whole column 1 can be separated at the area of the boundary between the metal tube part 16a and the glass tube 17 as represented by the broken line in the Figure. The helix 22 can then be removed very easily without disturbing the glass tube 17.

It is believed that the rate at which contaminants build up on the conductive helix 22 is reduced at elevated temperatures. With this in mind, instead of maintaining the helix at a uniform potential, as described above, a potential difference may be applied across its ends to cause a heating current, e.g. in the order of 1 Amp, to flow therethrough. It is thought that the uniform rate of change of potential over the length of the glass tube 17 and the relatively low potential difference (compared with the accelerating voltage) necessary to generate this current would not adversely affect the operation of the apparatus to any significant extent. Moreover, it is noted that a heating current may be passed through the helix not only when the electron beam is in use, but additionally or alternatively at other times to prolong the useful operating period of the tube before needing to be changed or cleaned.

In view of the description so far it will be evident to a person skilled in the art that many modifications may be made within the scope of this invention, and it is noted that the particular configuration of the various elements of the electron beam column described previously is merely exemplary. Thus for example, arrangements are envisaged where the deflection coils are situated in alternative locations in the column. Hence the deflection coils may be disposed on the opposite (downstream) side of the final lens system, that is to say, between the final lens system 13a, 13b and the workchamber 6. Alternatively, the deflection coils may be disposed entirely or partially within the final lens system, and in the latter case the deflection coils may project from either the upstream or downstream side of the final lens system.

Also it is noted that use of the helically wound conductive tube is not restricted to the vicinity of deflection coils but may be used elsewhere in the electron beam column where the tube may be subject to a varying magnetic field.

Finally, attention is drawn to the fact that while the specific embodiment described above relates to an electron optical column producing a Gaussian round beam with a fixed spot size, the invention is equally applicable to electron optical columns producing a beam spot whose size and shape are both variable. Moreover, the invention also has applications outside electron beam lithography. Thus for example, apparatus in accordance with the invention may take the form of an electron microscope or a machine producing a beam of charged particles other than electrons.

I claim:

1. In a charged particle beam apparatus comprising first means for generating a beam of charged particles, second means for directing said beam toward a target, a tube having a longitudinal bore, said bore forming a vacuum envelope, and said beam traveling through said bore, and third means disposed outside said tube for generating a variable magnetic beam deflection field for said beam within said tube, the improvement comprising said tube including a first metal section, a second metal section, and a non-conductive section containing a grounded, helically wound conductive filament disposed between said first and said second sections, said filament being closely wound, wherein eddy currents induced in said helically wound conductive filament by said variable magnetic beam deflection field are impeded between adjacent turns of said helically wound filament, and wherein said helically wound conductive filament is connected respectively at opposite ends to said first section and said second section.

2. A charged particle beam apparatus according to claim 1, wherein said helically wound filament has a thin film resistive coating for impeding said eddy currents.

3. A charged particle beam apparatus according to claim 2, wherein said helically wound finalment is nichrome, and said resistive coating is an oxide of nichrome.

4. A charged particle beam apparatus according to claim 1 or claim 2 or claim 3, wherein said helically wound filament is a removable insert within said nonconductive section.

5. A charged particle beam apparatus according to claim 4, wherein said third means include deflection coils for deflecting said beam within said tube.

6. A charged particle beam apparatus according to claim 5, wherein said deflection coils are disposed about said helically wound conductive filament.

7. A charged particle beam apparatus according to claim 1 or claim 2 or claim 3, wherein said third means include deflection coils for deflecting said beam within said tube.

8. A charged particle beam apparatus according to claim 7, wherein said deflection coils are disposed about said helically wound conductive filament.

9. A charged particle beam apparatus according to claim 1 or claim 2 or claim 3, wherein said helically wound conductive filament includes a single wire in a helix configuration.

* * * * *